United States Patent
Tien et al.

(10) Patent No.: US 9,098,668 B2
(45) Date of Patent: Aug. 4, 2015

(54) LAYOUT OF AN INTEGRATED CIRCUIT

(71) Applicant: Taiwan Semiconductor Manufacturing Company, Ltd., Hsin-Chu (TW)

(72) Inventors: Li-Chun Tien, Tainan (TW);
Hui-Zhong Zhuang, Kaohsiung (TW);
Ting-Wei Chiang, New Taipei (TW);
Hsiang-Jen Tseng, Hsin-Chu (TW);
Wei-Yu Chen, Hsin-Chu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 0 days.

(21) Appl. No.: 14/092,697

(22) Filed: Nov. 27, 2013

(65) Prior Publication Data

US 2015/0149976 A1      May 28, 2015

(51) Int. Cl.
*G06F 17/50* (2006.01)

(52) U.S. Cl.
CPC .................................. *G06F 17/5072* (2013.01)

(58) Field of Classification Search
CPC ............ G06F 17/5068; G06F 17/5077; G06F 17/5072; G06F 17/5045; H01L 27/0207
USPC .......................................................... 716/120
See application file for complete search history.

(56) References Cited

U.S. PATENT DOCUMENTS

2006/0190893 A1 * 8/2006 Morton ........................... 716/10

\* cited by examiner

*Primary Examiner* — Jack Chiang
*Assistant Examiner* — Brandon Bowers
(74) *Attorney, Agent, or Firm* — Slater & Matsil, L.L.P.

(57) ABSTRACT

A cell layout includes a first metal line for VDD power, which includes a first jog coupling to and being perpendicular to the first metal line. A second metal line is for VSS power, and includes a second jog coupling to and being perpendicular to the second metal line. The cell layout includes an upper cell boundary, a lower cell boundary, a first cell boundary and a second cell boundary. The upper cell boundary and the lower cell boundary extend along X direction. The first cell boundary and the second cell boundary extend along Y direction. The upper cell boundary is defined in a portion of the first metal line. The lower cell boundary is defined in a portion of the second metal line. The first cell boundary is defined in a portion of the first jog and a portion of the second jog.

20 Claims, 7 Drawing Sheets

LAYOUT OF AN INTEGRATED CIRCUIT

FIELD OF DISCLOSURE

The present disclosure is related to integrated circuits and, more particularly, to layout of integrated circuits.

BACKGROUND

The trend in very-large-scale integration (VLSI) technology has resulted in narrower interconnection lines and smaller contacts. Furthermore, integrated circuit designs are becoming more complex and denser. More devices are compressed in integrated circuits to improve performance.

In the design of an integrated circuit, standard cells having predetermined functions are used. Layouts of standard cells are stored in cell libraries. When designing an integrated circuit, the respective layouts of the standard cells are retrieved from the cell libraries and placed into one or more desired locations on an integrated circuit layout. Routing is then performed to connect the standard cells with each other using interconnection tracks.

DETAILED DESCRIPTION

Making and using various embodiments of the disclosure are discussed in detail below. It should be appreciated, however, that the embodiments provide many applicable inventive innovations that can be embodied in a wide variety of specific contexts. The specific embodiments discussed are merely illustrative, and do not limit the scope of the disclosure.

Some embodiments have one or a combination of the following features and/or advantages. A cell layout includes a first metal line and a second metal line. The first metal line is for VDD power, which includes a first jog coupling to and being perpendicular to the first metal line. The second metal line is for VSS power, which includes a second jog coupling to and being perpendicular to the second metal line. The cell layout also includes an upper cell boundary, a lower cell boundary, a first cell boundary and a second cell boundary. The upper cell boundary and the lower cell boundary are defined along an X direction. The first cell boundary and the second cell boundary are defined along a Y direction. The upper cell boundary is defined in a portion of the first metal line. The lower cell boundary is defined in a portion of the second metal line. The first cell boundary is defined in a portion of the first jog and a portion of the second jog. The first metal line together with the first jog form a first L-like shape metal line; the second metal line together with the second jog form a second L-like shape metal line. The first and the second L-like shape metal lines are formed on respective corners of a same side of the cell layout.

Figure 1:
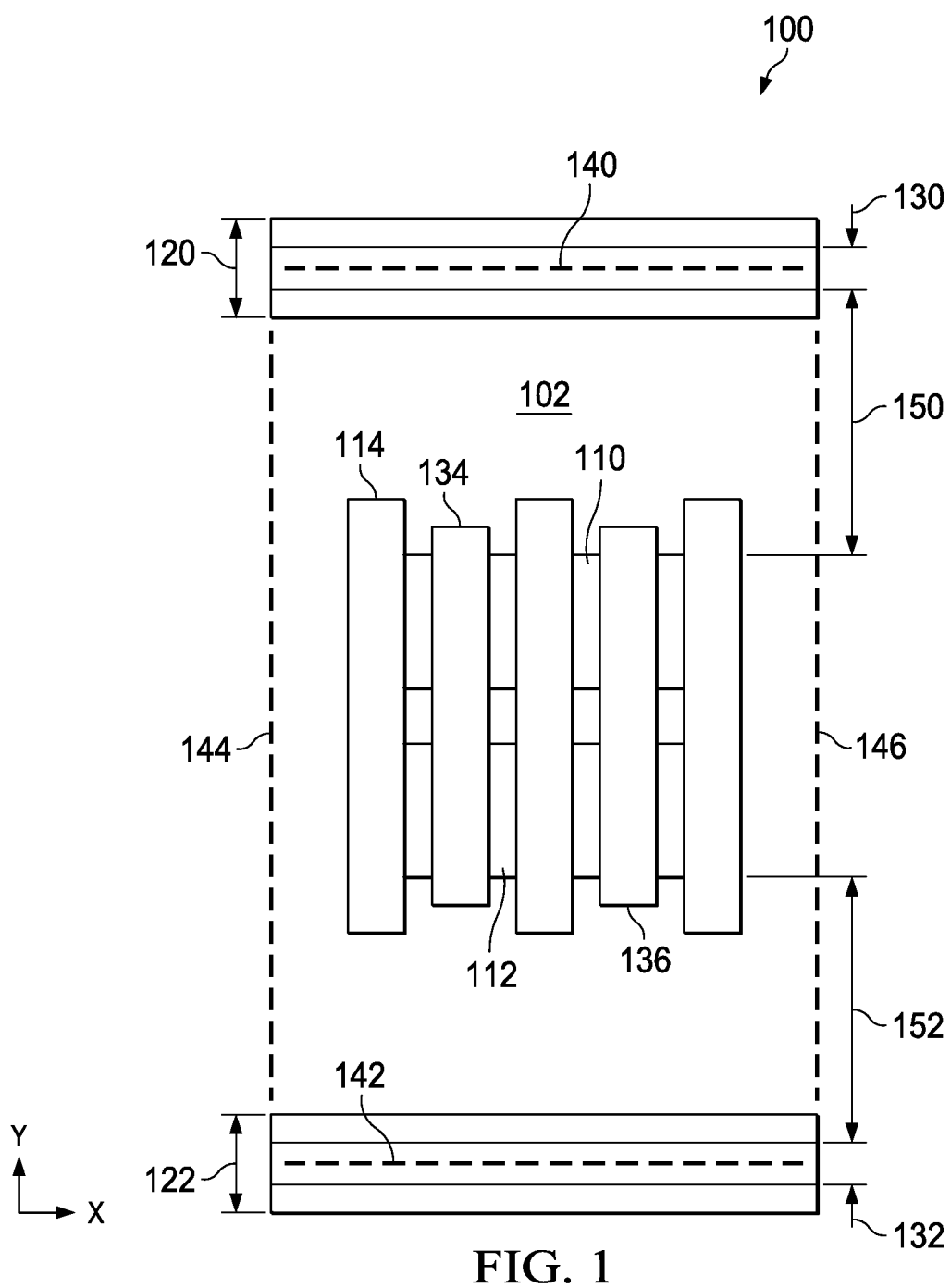
FIG. 1 is a top view of a layout 100 in accordance with some embodiments.

FIG. 1 is a top view of a layout 100 according to some embodiments. The layout 100 is arranged to implement corresponding function of a cell of a standard cell library. For simplicity, the layout 100 only includes necessary components for illustration purpose. The cell has cell boundaries indicated by reference lines 140 and 142 along X direction and indicated by reference lines 144 and 146 along Y direction. The cell boundaries define cell regions of the cell. In FIG. 1, a semiconductor substrate, active areas, gate electrode layers and various metallic layers are overlapped. Semiconductor substrate 102 is a silicon or another suitable semiconductor substrate. P-type active region 110 and N-type active region 112 are formed within the semiconductor substrate 102. The P-type active region 110 is arranged to form one or more P-type transistors. Similarly, the N-type active region 112 is arranged to form one or more N-type transistors. In some embodiments, an active region, such as the active regions 110 and 112, is also referred to herein as OD (oxide-dimensioned region, or sometimes referred to as oxide definition region or oxide defined region).

Gate electrodes 114 are disposed over the P-type active region 110 and N-type active region 112, and are arranged in parallel with each other and equally spaced apart. The gate electrodes 114 are formed of polysilicon or other conductive materials such as metals, metal alloys and metal silicides. For illustration purpose, only one gate electrode is labeled. In some embodiments, a gate electrode, such as the gate electrodes 114, are also referred to herein as PO.

Metal one lines 120 and 122, extended along X direction, are power lines for VDD voltage and VSS voltage, respectively. The cell boundary 140 is defined in a portion of the metal one line 120 extending along the X direction. The cell boundary 142 is defined in a portion of the metal one line 122 extending along the X direction. In some embodiments, a metal one line is referred to herein as M1. In a top-down sequence, the metal one lines 120 and 122 are connected through conductive lines and conductive vias (not shown) to each of source regions (in the OD 110 and 112) of the corresponding P-type transistors and N-type transistors, respectively. In a top-down sequence, a metal one line is connected through conductive lines and conductive vias (not shown) to corresponding gate electrodes 114.

In some embodiments, metal two lines are arranged to extend along Y direction. For example, metal two lines 134 and 136, extended along Y direction, are disposed over P-type active region 110 and N-type active region 112. In some embodiments, metal two lines are also arranged to extend along X direction. For example, metal two lines 130 and 132, extended along X direction, are disposed over metal one lines 120 and 122, respectively. As a result, the metal two lines 130, 132 are perpendicular to the metal two lines 134, 136. In a top-down sequence, a metal two line is connected through conductive via one (not shown) to corresponding metal one line. In some embodiments, the metal one lines 120 and 122 are connected through respective metal two lines 130 and 132 to respective power and ground meshes (not shown) at upper metal lines (not shown). In some embodiments, a metal two line is referred to herein as M2.

In some embodiments, a distance 150, between the horizontal metal two line 130 and the vertical metal two lines 134 and 136, are governed by a set of predetermined design rules associated with a predetermined manufacturing process that is used to manufacture the cell. As a result, the distance 150 needs to be satisfied to avoid design rule violations. The cell boundary 140 needs to be defined apart from the vertical metal two lines 134, 136 about the distance 150 or more. Similarly, a distance 152, between the horizontal metal two line 132 and the vertical metal two lines 134 and 136, needs to be satisfied to avoid of design rule violations. The cell boundary 142 needs to be defined apart from the vertical metal two lines 134, 136 about the distance 152 or more. In such a situation, area penalty of the cell is suffered in order to meet the set of predetermined design rules.

Figure 2:
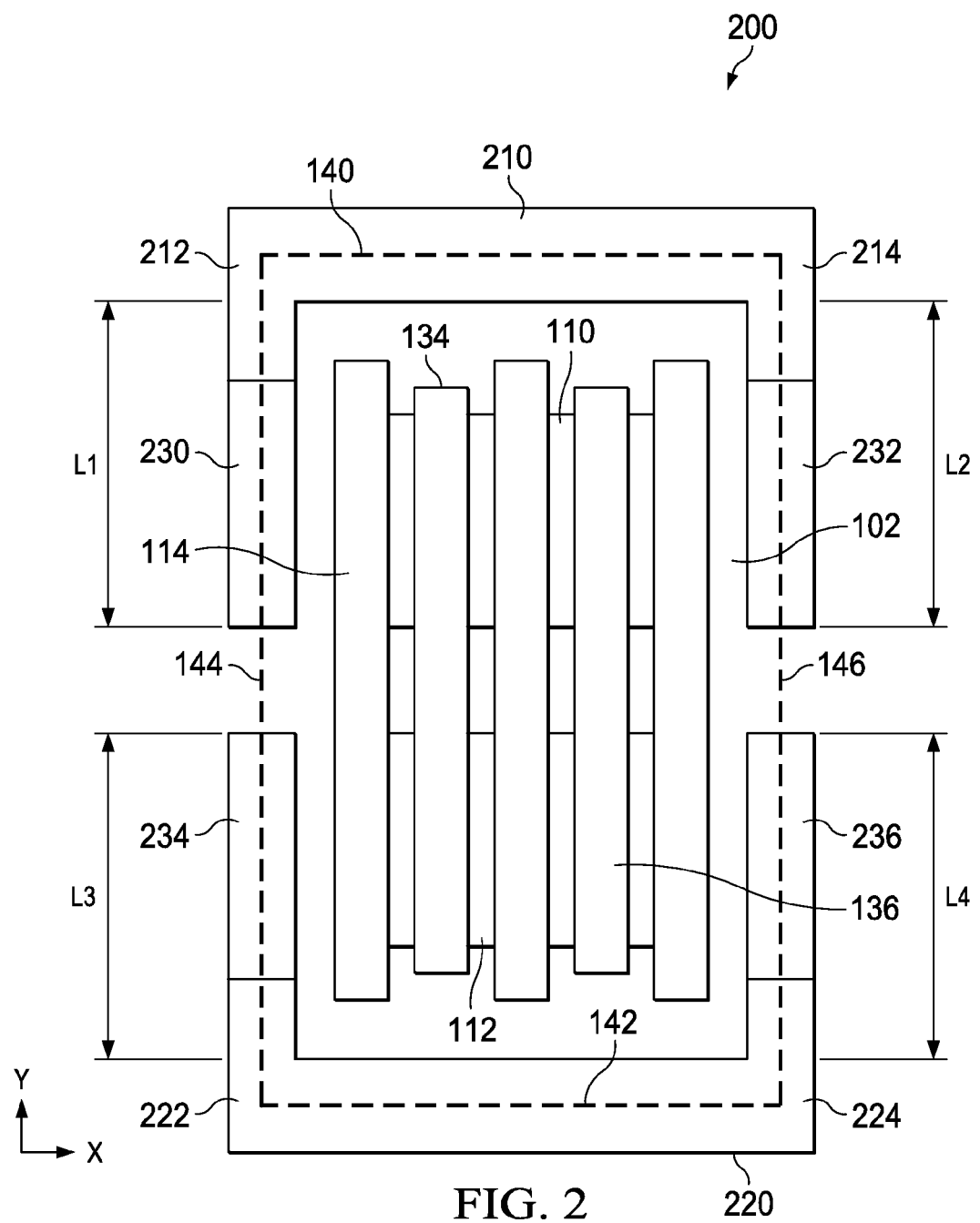
FIG. 2 is a top view of a layout 200 in accordance with some embodiments.

FIG. 2 is a top view of a layout 200 according to some embodiments. Compared with the layout 100 in FIG. 1, the layout 200 includes similar elements except for metal one lines 210-224 and metal two lines 230-236 that are different from the respective elements in FIG. 1. The metal one line 210, extended along X direction, is a power line for VDD voltage. The cell boundary 140 is defined in a portion of the metal one line 210 extending along the X direction. Furthermore, the metal one line 210 includes two jogs 212 and 214 that are extended along Y direction. The jogs 212 and 214 are coupled to and are perpendicular to the metal one line 210. The cell boundary 144 is defined in a portion of the jog 212 extending along the Y direction. The cell boundary 146 is defined in a portion of the jog 214 extending along the Y direction. In some embodiments, a metal line is used in place of a jog. For simplicity, the terms jog and metal line are used interchangeably in this disclosure and such use should not limit the scope of the claims appended herewith.

In some embodiments, the metal one line 210 is connected through metal two lines 230 and 232 to respective power meshes (not shown) at upper metal lines (not shown). The metal two lines 230 and 232 are disposed over and are in parallel with the jogs 212 and 214, respectively. In such a situation, the metal two lines 230 and 232 are in parallel with the metal two lines 134 and 136, there is no horizontal metal two line that is adjacent to and perpendicular to the metal two lines 134, 136. As a result, there is no spacing check of design rule in FIG. 2 as indicated in FIG. 1 to limit necessary spacing between the cell boundaries 140 and the metal two lines 134, 136.

Similarly, the metal one line 220, extended along X direction, is a power line for VSS voltage. The cell boundary 142 is defined in a portion of the metal one line 220 extending along the X direction. Furthermore, the metal one line 220 includes two jogs 222 and 224 that are extended along Y direction. The jogs 222 and 224 are coupled to and are perpendicular to the metal one line 220. The cell boundary 144 is defined in a portion of the jog 222 extending along the Y direction. The cell boundary 146 is defined in a portion of the jog 224 extending along the Y direction. In some embodiments, the metal one lines 220 is connected through metal two lines 234 and 236 to respective ground meshes (not shown) at upper metal lines (not shown). The metal two lines 234 and 236 are disposed over and are in parallel with the jogs 222 and 224, respectively. In such a situation, the metal two lines 234 and 236 are in parallel with the metal two lines 134 and 136, there is no horizontal metal two line that is adjacent to and perpendicular to the metal two lines 134, 136. As a result, there is no spacing check of design rule in FIG. 2 as in FIG. 1 to limit necessary spacing between the cell boundaries 142 and the metal two lines 134, 136. For the reasons above, cell area of FIG. 2 is more compact than corresponding cell area of FIG. 1.

In some embodiments, the metal one line 210 and the jogs 212, 214 form a U-like shape metal line after flipping over X axis. In some embodiments, the metal one line 220 and the jogs 222, 224 form a U-like shape metal line.

In some embodiments, a jog length L1 of the jog 212 is equal to a jog length L2 of the jog 214. In some embodiments, the jog length L1 of the jog 212 is less than the jog length L2 of the jog 214. In some embodiments, the jog length L1 of the jog 212 is larger than the jog length L2 of the jog 214. In some embodiments, a jog length L3 of the jog 222 is equal to a jog length L4 of the jog 224. In some embodiments, the jog length L3 of the jog 222 is less than the jog length L4 of the jog 224. In some embodiments, the jog length L3 of the jog 222 is larger than the jog length L4 of the jog 224.

In some embodiments, the jog length L1 of the jog 212 is equal to the jog length L3 of the jog 222 or the jog length L4 of the jog 224. In some embodiments, the jog length L1 of the jog 212 is less than the jog length L3 of the jog 222 or the jog length L4 of the jog 224. In some embodiments, the jog length L1 of the jog 212 is larger than the jog length L3 of the jog 222 or the jog length L4 of the jog 224.

In some embodiments, the jog length L2 of the jog 214 is equal to the jog length L3 of the jog 222 or the jog length L4 of the jog 224. In some embodiments, the jog length L2 of the jog 214 is less than the jog length L3 of the jog 222 or the jog length L4 of the jog 224. In some embodiments, the jog length L2 of the jog 214 is larger than the jog length L3 of the jog 222 or the jog length L4 of the jog 224.

Figure 3:
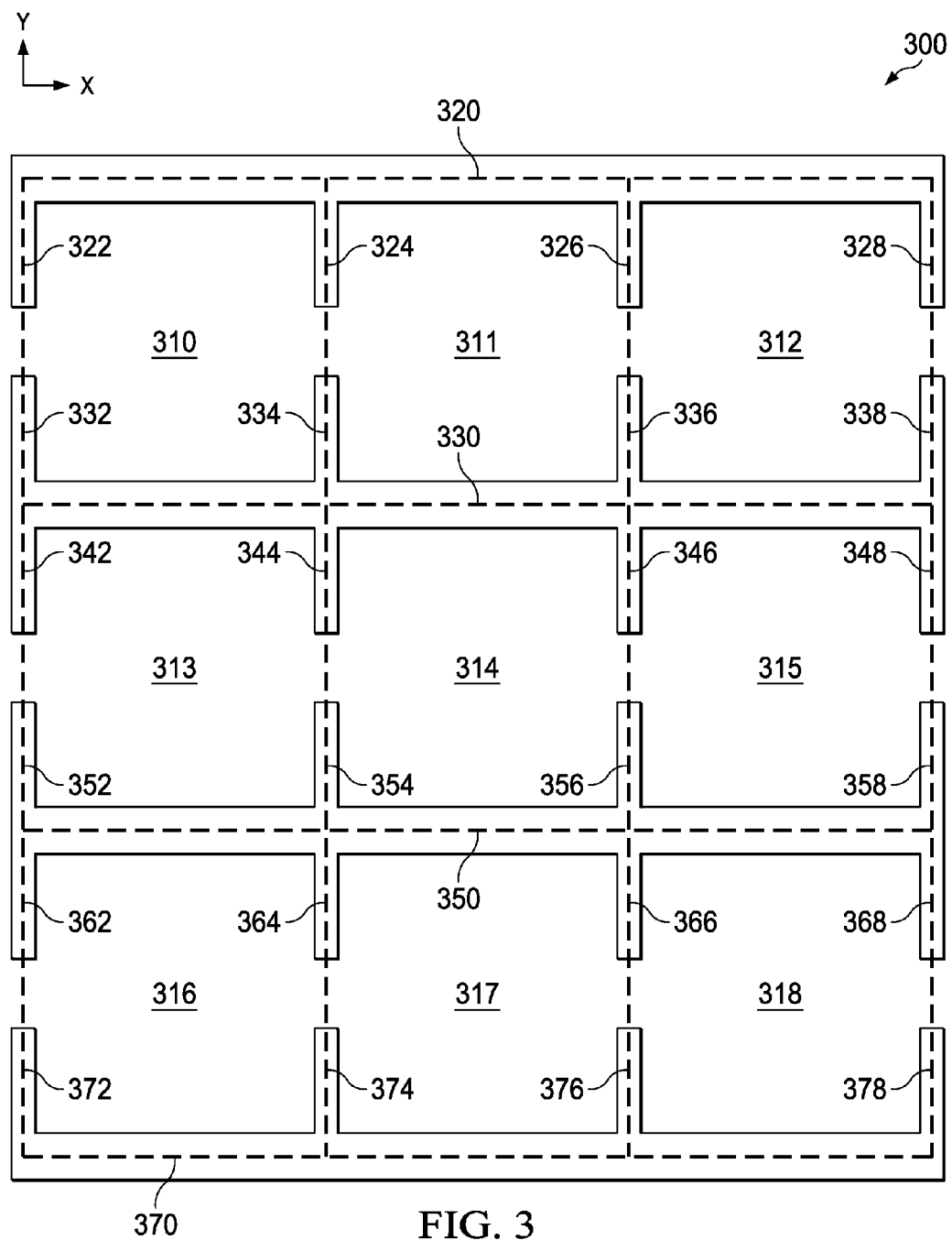
FIG. 3 is a top view of a layout 300 in accordance with some embodiments.

FIG. 3 is a top view of a layout 300 according to some embodiments. For simplicity, only metal one lines for VDD and VSS power lines are shown in FIG. 3. The metal one line 320 is for VDD power line with jogs 322-328. The metal one line 330 is for VSS power line with jogs 332-348. The metal one line 350 is for VDD power line with jogs 352-358. The metal one line 370 is for VSS power line with jogs 372-378.

The layout 300 includes cells 310-318 that are abutted together along X direction and Y direction. Although the layout 300 only shows nine cells, any number of cells is within the scope of various embodiments. Each of the cells 310-318 includes similar metal one line structure for VDD and VSS power lines as the corresponding elements in FIG. 2. For example, the metal one line 320 with the jogs 322 and 324 in the cell 310 is similar to the metal one line 210 with the jogs 212 and 214 in FIG. 2. The metal one line 330 with the jogs 332 and 334 in the cell 310 is similar to the metal one line 220 with the jogs 222 and 224 in FIG. 2. For simplicity, sizes of the cells 310-318 are identical. In some embodiments, the cell 310 and the cell 311 are abutted against Y axis. The VDD and VSS power lines of the cell 310 are coupled to the VDD and VSS power lines of the cell 311, respectively. Furthermore, the respective rightmost jogs of the VDD and VSS power lines of the cell 310 are coupled to the respective leftmost jogs of the VDD and VSS power lines of the cell 311 to form the respective jogs 324 and 334.

In some embodiments, the cell 310 and the cell 313 are abutted against X axis. Before abutment, the cell 313 is arranged to flip over X axis first such that the VSS power line of the cell 310 is coupled with the VSS power line of the cell 313. In some embodiments, the metal one line 322 for VDD power line is physically separated from the metal one line 352 for VDD power line. In some embodiments, the metal one line 332 for VSS power line is coupled to the metal one line 342 for VSS power line. In some embodiments, the metal one lines 322, 352 for VDD power lines and the metal one lines 332, 342 for VSS power lines are vertically aligned in the Y direction. In some embodiments, the metal one lines 332 and 342 for the VSS power lines are vertically interposed between the metal one line 322 and 352 for the VDD power lines along Y direction.

In some embodiments, the cell 313 and the cell 316 are abutted against X axis. Before abutment, the cell 316 is arranged to flip over X axis first such that the VDD power line of the cell 313 is coupled with the VDD power line of the cell 316. In some embodiments, the metal one line 342 for VSS power line is physically separated from the metal one line 372 for VSS power line. In some embodiments, the metal one line 352 for VDD power line is coupled to the metal one line 362 for VDD power line. In some embodiments, the metal one lines 342, 372 for VSS power lines and the metal one lines 352, 362 for VDD power lines are vertically aligned in the Y direction. In some embodiments, the metal one lines 352 and 362 for the VDD power lines are vertically interposed between the metal one line 342 and 372 for the VSS power lines along Y direction.

Figure 4A:
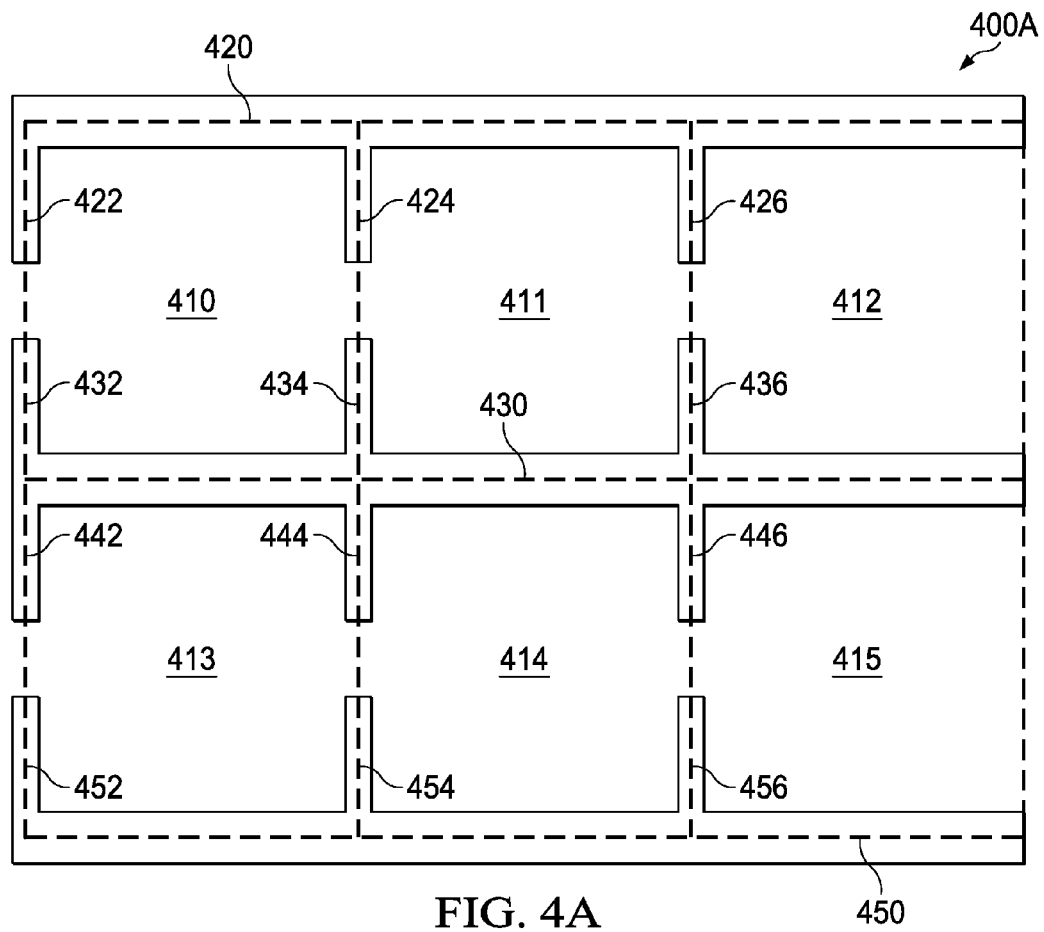
FIG. 4A is a top view of a layout 400A in accordance with some embodiments.

FIG. 4A is a top view of a layout 400A according to some embodiments. For simplicity, only metal one lines for VDD and VSS power lines are shown in FIG. 4A. The metal one line 420 is for VDD power line with jogs 422-426. The metal one line 430 is for VSS power line with jogs 432-446. The metal one line 450 is for VDD power line with jogs 452-456.

The layout 400A includes cells 410-415 that are abutted together along X direction and Y direction. Although the layout 400A only shows six cells, any number of cells is within the scope of various embodiments. Each of the cells 410-415 includes similar metal one line structure for VDD and VSS power lines as corresponding components of a layout 400B in FIG. 4B. For simplicity, sizes of the cells 410-415 are identical.

Figure 4B:
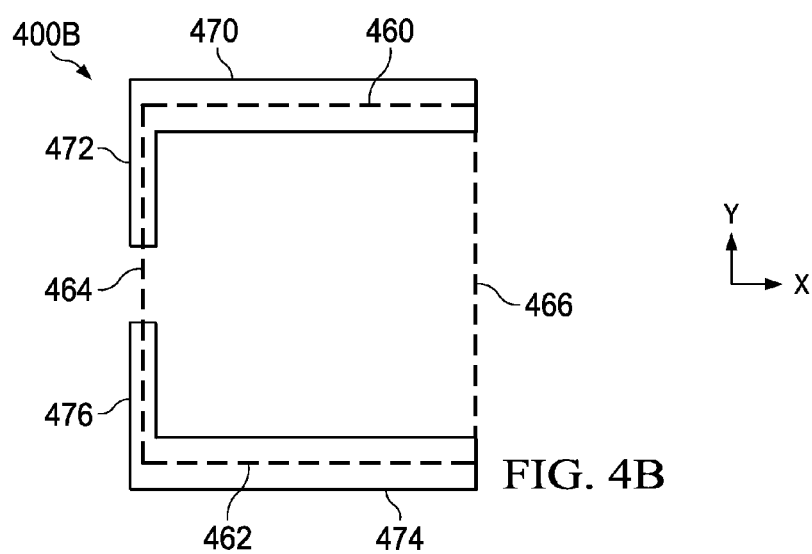
FIG. 4B is a top view of a layout 400B of a cell in accordance with some embodiments.

In FIG. 4B, a metal one line 470, extended along X direction, is a power line for VDD voltage. A cell boundary 460 is defined in a portion of the metal one line 470 extending along the X direction. Furthermore, the metal one line 470 includes a jog 472 that is extended along Y direction. A cell boundary 464 is defined in a portion of the jog 472 extending along the Y direction. A metal one line 474, extended along X direction, is a power line for VSS voltage. A cell boundary 462 is defined in a portion of the metal one line 474 extending along the X direction. Furthermore, the metal one line 474 includes a jog 476 that is extended along Y direction. The cell boundary 464 is defined in a portion of the jog 476 extending along the Y direction.

In some embodiments, the metal one line 470 and the jog 472 form a L-like shape metal line and occupy a top-left corner of the layout 400B. In some embodiments, the metal one line 474 and the jog 476 form a L-like shape metal line and occupy a bottom-left corner of the layout 400B. In some embodiments, the two L-like shape metal lines are formed on respective corners of a left side of the layout 400B.

Referring back to FIG. 4A, in some embodiments, the cell 410 and the cell 411 are abutted against Y axis. The VDD and VSS power lines of the cell 410 are coupled to the VDD and VSS power lines of the cell 411, respectively. Furthermore, the leftmost jogs of the VDD and VSS power lines of the cell 411 are coupled to rightmost cell boundary of the cell 410 to form the respective jogs 424 and 434. In some embodiments, the cell 410 and the cell 413 are abutted against X axis. Before abutment, the cell 413 is arranged to flip over X axis first such that the VSS power line of the cell 410 is coupled with the VSS power line of the cell 413.

In some embodiments, the metal one line 422 for VDD power line is physically separated from the metal one line 452 for VDD power line. In some embodiments, the metal one line 432 for VSS power line is coupled to the metal one line 442 for VSS power line. In some embodiments, the metal one lines 422, 452 for VDD power lines and the metal one lines 432, 442 for VSS power lines are vertically aligned in the Y direction. In some embodiments, the metal one lines 432 and 442 for the VSS power lines are vertically interposed between the metal one line 422 and 452 for the VDD power lines along Y direction.

Figure 5A:
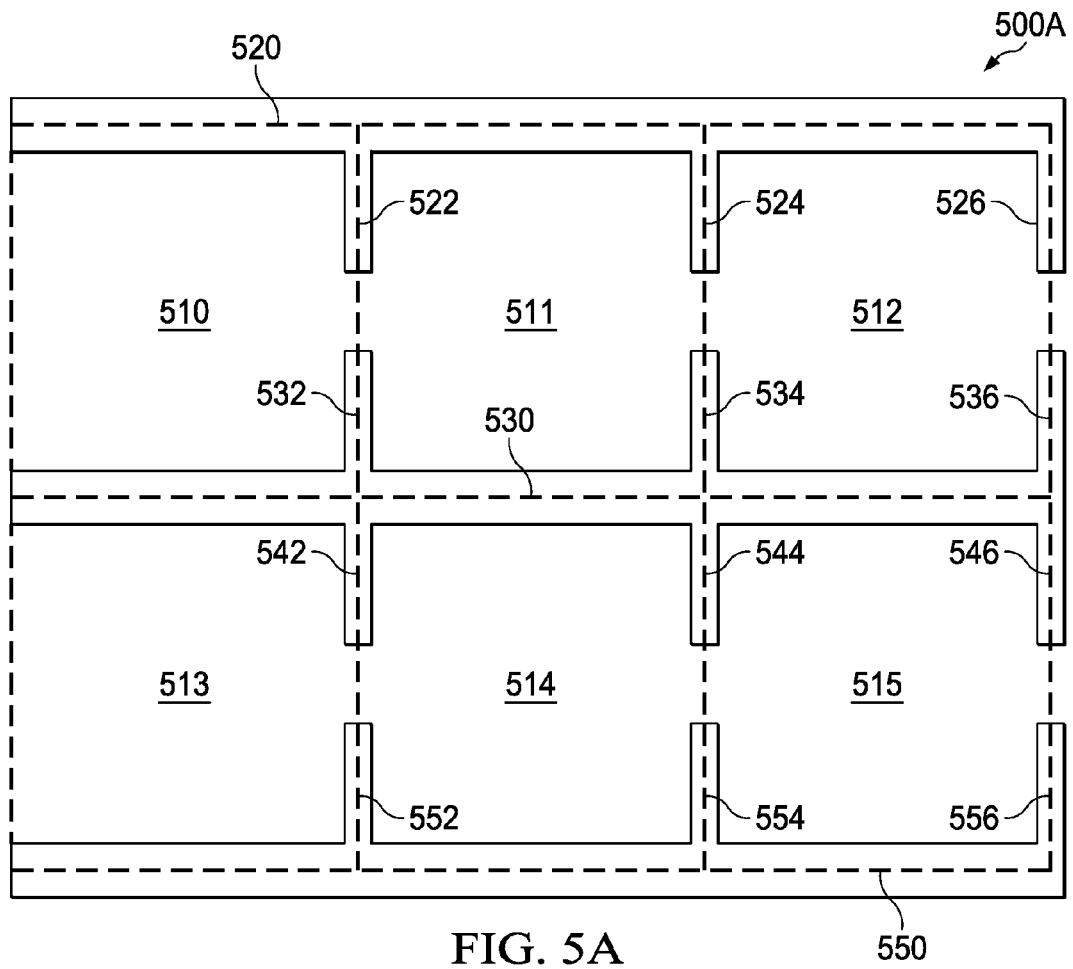
FIG. 5A is a top view of a layout 500A in accordance with some embodiments.

FIG. 5A is a top view of a layout 500A according to some embodiments. For simplicity, only VDD and VSS power lines in metal one lines are shown in FIG. 5A. The metal one line 520 is for VDD power line with jogs 522-526. The metal one line 530 is for VSS power line with jogs 532-546. The metal one line 550 is for VDD power line with jogs 552-556.

The layout 500A includes cells 510-515 that are abutted together along X direction and Y direction. Although the layout 500A only shows six cells, any number of cells is within the scope of various embodiments. Each of the cells 510-515 includes similar metal one line structure for VDD and VSS power lines as corresponding components of a layout 500B in FIG. 5B. For simplicity, sizes of the cells 510-515 are identical.

Figure 5B:
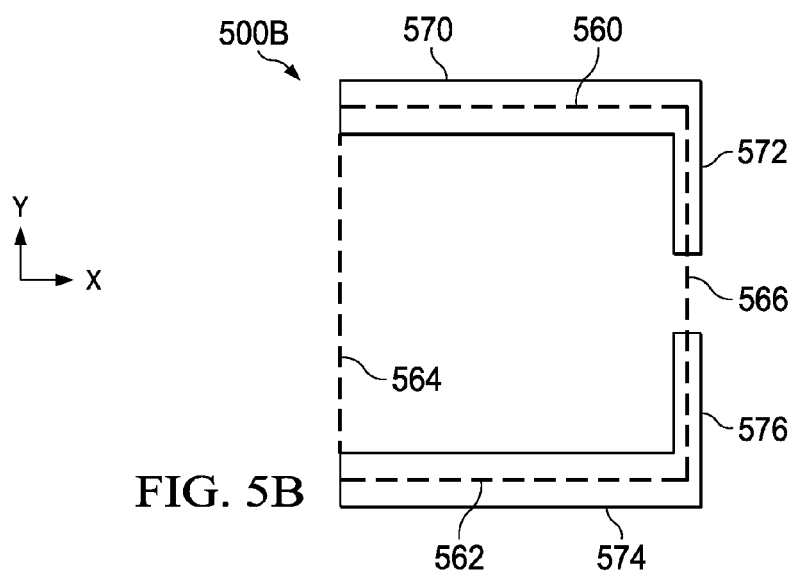
FIG. 5B is a top view of a layout 500B of a cell in accordance with some embodiments.

In FIG. 5B, a metal one line 570, extended along X direction, is a power line for VDD voltage. A cell boundary 560 is defined in a portion of the metal one line 570 extending along the X direction. Furthermore, the metal one line 570 includes a jog 572 that is extended along Y direction. A cell boundary 566 is defined in a portion of the jog 572 extending along the Y direction. A metal one line 574, extended along X direction, is a power line for VSS voltage. A cell boundary 562 is defined in a portion of the metal one line 574 extending along the X direction. Furthermore, the metal one line 574 includes a jog 576 that is extended along Y direction. The cell boundary 566 is defined in a portion of the jog 576 extending along the Y direction.

In some embodiments, the metal one line 570 and the jog 572 form a L-like shape metal line and occupy a top-right corner of the layout 500B. In some embodiments, the metal one line 574 and the jog 576 form a L-like shape metal line and occupy a bottom-right corner of the layout 500B. In some embodiments, the two L-like shape metal lines are formed on respective corners of a right side of the layout 500B.

Referring back to FIG. 5A, in some embodiments, the cell 510 and the cell 511 are abutted against Y axis. The VDD and VSS power lines of the cell 510 are coupled to the VDD and VSS power lines of the cell 511, respectively. Furthermore, the rightmost jogs of the VDD and VSS power lines of the cell 510 are coupled to leftmost cell boundary of the cell 511 to form the respective jogs 522 and 532. In some embodiments, the cell 510 and the cell 513 are abutted against X axis. Before abutment, the cell 513 is arranged to flip over X axis first such that the VSS power line of the cell 510 is coupled with the VSS power line of the cell 513.

In some embodiments, the metal one line 522 for VDD power line is physically separated from the metal one line 552 for VDD power line. In some embodiments, the metal one line 532 for VSS power line is coupled to the metal one line 542 for VSS power line. In some embodiments, the metal one lines 522, 552 for VDD power lines and the metal one lines 532, 542 for VSS power lines are vertically aligned in the Y direction. In some embodiments, the metal one lines 532 and 542 for the VSS power lines are vertically interposed between the metal one line 522 and 552 for the VDD power lines along Y direction.

Figure 6A:
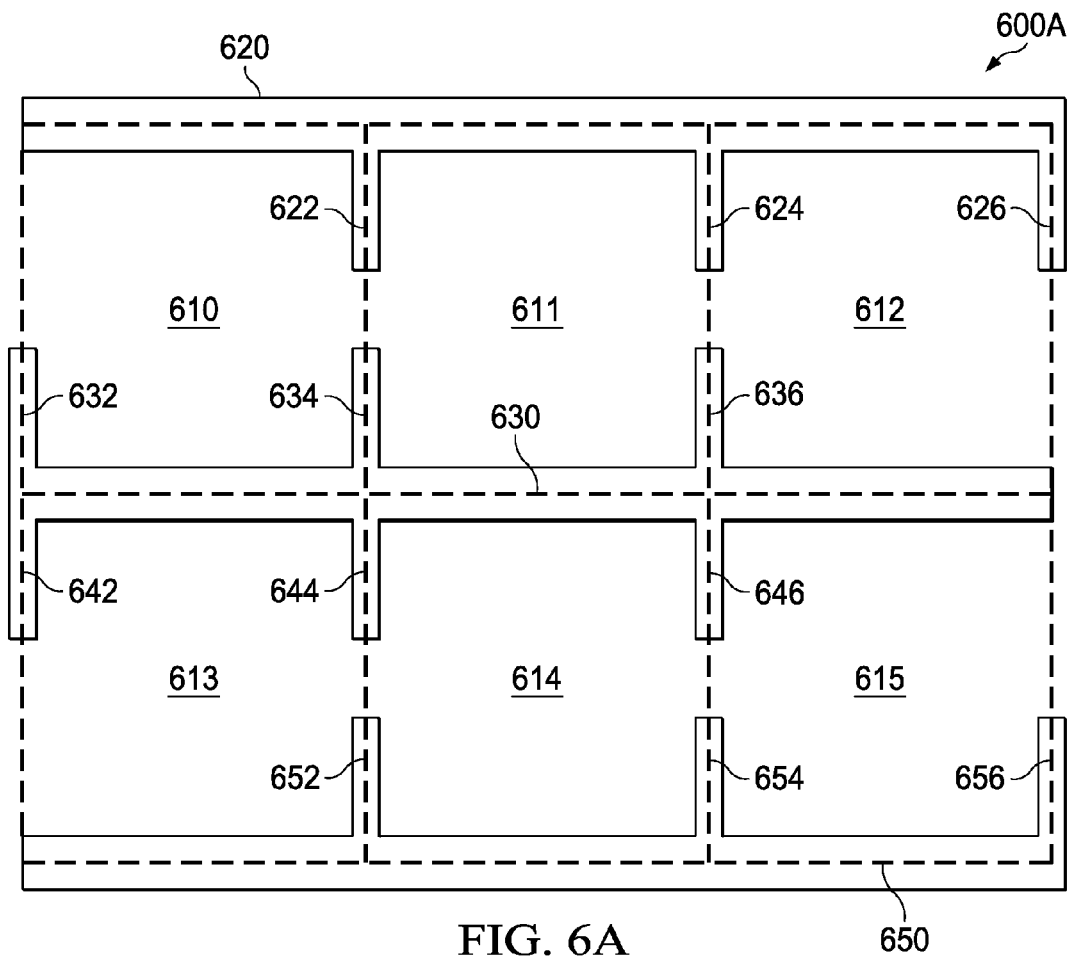
FIG. 6A is a top view of a layout 600A in accordance with some embodiments.

FIG. 6A is a top view of a layout 600A according to some embodiments. For simplicity, only VDD and VSS power lines in metal one lines are shown in FIG. 6A. The metal one line 620 is for VDD power line with jogs 622-626. The metal one line 630 is for VSS power line with jogs 632-646. The metal one line 650 is for VDD power line with jogs 652-656.

The layout 600A includes cells 610-615 that are abutted together along X direction and Y direction. Although the layout 600A only shows six cells, any number of cells is within the scope of various embodiments. Each of the cells 610-615 includes similar metal one line structure for VDD and VSS power lines as corresponding components of a layout 600B in FIG. 6B. For simplicity, sizes of the cells 610-615 are identical.

Figure 6B:
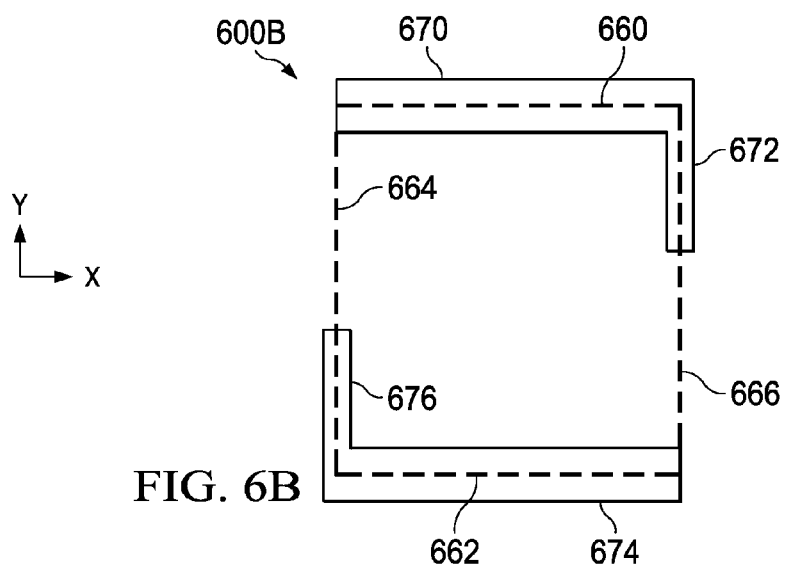
FIG. 6B is a top view of a layout 600B of a cell in accordance with some embodiments.

In FIG. 6B, a metal one line 670, extended along X direction, is a power line for VDD voltage. A cell boundary 660 is defined in a portion of the metal one line 670 extending along the X direction. Furthermore, the metal one line 670 includes a jog 672 that is extended along Y direction. A cell boundary 666 is defined in a portion of the jog 672 extending along the Y direction. A metal one line 674, extended along X direction, is a power line for VSS voltage. A cell boundary 662 is defined in a portion of the metal one line 674 extending along the X direction. Furthermore, the metal one line 674 includes a jog 676 that is extended along Y direction. A cell boundary 664 is defined in a portion of the jog 676 extending along the Y direction.

In some embodiments, the metal one line 670 and the jog 672 form a L-like shape metal line and occupy a top-right corner of the layout 600B. In some embodiments, the metal one line 674 and the jog 676 form a L-like shape metal line and occupy a bottom-left corner of the layout 600B. In some embodiments, the two L-like shape metal lines are formed diagonally on opposite corner of the layout 600B.

Referring back to FIG. 6A, in some embodiments, the cell 610 and the cell 611 are abutted against Y axis. The VDD and VSS power lines of the cell 610 are coupled to the VDD and VSS power lines of the cell 611, respectively. Furthermore, the rightmost jog of the VDD power line of the cell 610 is coupled to leftmost cell boundary of the cell 611 to form the respective jogs 622. The leftmost jog of the VSS power line of the cell 611 is coupled to rightmost cell boundary of the cell 610 to form the respective jogs 634. In some embodiments, the cell 610 and the cell 613 are abutted against X axis. Before abutment, the cell 613 is arranged to flip over X axis first such that the VSS power line of the cell 610 is coupled with the VSS power line of the cell 613.

In some embodiments, the metal one line 622 for VDD power line is physically separated from the metal one line 652 for VDD power line. In some embodiments, the metal one line 632 for VSS power line is coupled to the metal one line 642 for VSS power line. In some embodiments, the metal one lines 622, 652 for VDD power lines and the metal one lines 634, 644 for VSS power lines are vertically aligned in the Y direction. In some embodiments, the metal one lines 634 and 644 for the VSS power lines are vertically interposed between the metal one line 622 and 652 for the VDD power lines along Y direction.

Figure 7:
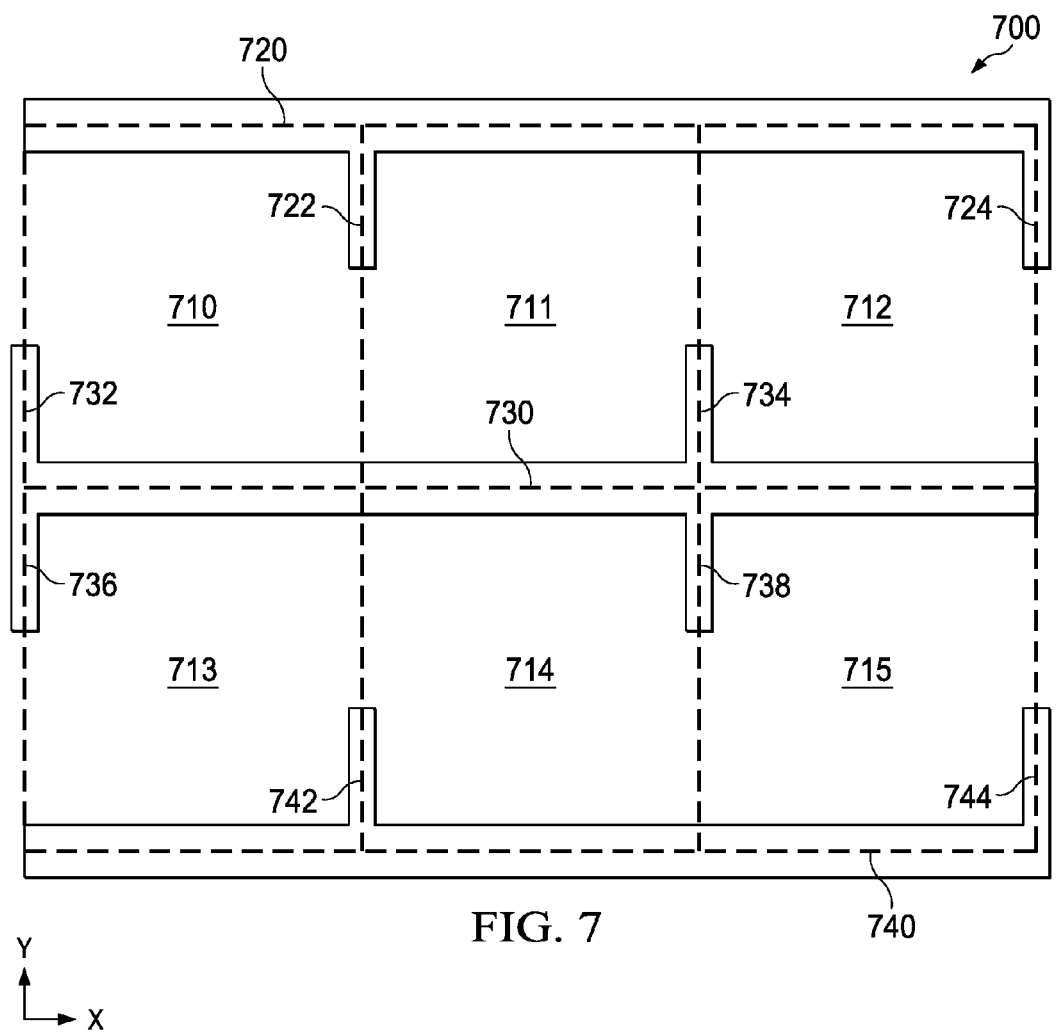
FIG. 7 is a top view of a layout 700 in accordance with some embodiments.

FIG. 7 is a top view of a layout 700 according to some embodiments. For simplicity, only VDD and VSS power lines in metal one lines are shown in FIG. 7. The metal one line 720 is for VDD power line with jogs 722 and 724. The metal one line 730 is for VSS power line with jogs 732, 734, 736, and 738. The metal one line 740 is for VDD power line with jogs 742 and 744.

The layout 700 includes cells 710-715 that are abutted together along X direction and Y direction. Although the layout 700 only shows six cells, any number of cells is within the scope of various embodiments. Each of the cells 710-715 includes similar metal one line structure for VDD and VSS power lines as corresponding components of the layout 600B in FIG. 6B. For simplicity, sizes of the cells 710-715 are identical.

In some embodiments, the cells 710-712 are abutted consecutively in a row along X direction. Before abutment, the cell 711 is arranged to flip over Y axis first. The VDD and VSS power lines of the cell 710 are coupled to the respective VDD and VSS power lines of the cells 711 and 712. The rightmost jog of the VDD power line of the cell 710 is coupled to leftmost jog of the VDD power line of the cell 711 to form the respective jog 722. The rightmost jog of the VSS power line of the cell 711 is coupled to leftmost jog of the VSS power line of the cell 712 to form the respective jog 734. In some embodiments, the cell 710 and the cell 713 are abutted against X axis. Before abutment, the cell 713 is arranged to flip over X axis first such that the VSS power line of the cell 710 is coupled with the VSS power line of the cell 713.

In some embodiments, the metal one line 722 for VDD power line is physically separated from the metal one line 742 for VDD power line. In some embodiments, the metal one line 732 for VSS power line is coupled to the metal one line 736 for VSS power line.

In some embodiments, a cell layout includes a first metal line and a second metal line. The first metal line is for VDD power, which includes a first jog coupling to and being perpendicular to the first metal line. The second metal line is for VSS power, which includes a second jog coupling to and being perpendicular to the second metal line. The cell layout also includes an upper cell boundary, a lower cell boundary, a first cell boundary and a second cell boundary. The upper cell boundary and the lower cell boundary define along X direction. The first cell boundary and the second cell boundary define along Y direction. The upper cell boundary is defined in a portion of the first metal line. The lower cell boundary is defined in a portion of the second metal line. The first cell boundary is defined in a portion of the first jog and a portion of the second jog.

In some embodiments, a cell layout includes a first metal line and a second metal line. The first metal line is for VDD power, which includes a first jog coupling to and being perpendicular to the first metal line. The second metal line is for VSS power, which includes a second jog coupling to and being perpendicular to the second metal line. The cell layout also includes an upper cell boundary, a lower cell boundary, a first cell boundary and a second cell boundary. The upper cell boundary and the lower cell boundary define along X direction. The first cell boundary and the second cell boundary define along Y direction. The upper cell boundary is defined in a portion of the first metal line. The lower cell boundary is defined in a portion of the second metal line. The first cell boundary is defined in a portion of the first jog. The second cell boundary is defined in a portion of the second jog.

In some embodiments, an integrated circuit layout includes a first cell and a second cell. Each of the first cell and the second cell includes a metal line of a first power line and a metal line of a second power line in a metal layer. A first metal is coupled to and is perpendicular to the metal line of the first power line of each of the first cell and the second cell in the metal layer. A second metal is coupled to and is perpendicular to the metal line of the second power line of each of the first cell and the second cell in the metal layer. A first cell boundary for each of the first cell and the second cell is defined in a portion of the first metal. A second cell boundary for each of the first cell and the second cell is defined in a portion of the second metal. The first cell and the second cell are abutted against X directions. The first metal of the first cell and the first metal of the second cell are vertically aligned in the Y direction.

While the disclosure has been described by way of examples and in terms of disclosed embodiments, the invention is not limited to the examples and disclosed embodiments. To the contrary, various modifications and similar arrangements are covered as would be apparent to those of ordinary skill in the art. Therefore, the scope of the appended claims should be accorded the broadest interpretation so as to encompass such modifications and arrangements.

What is claimed is:

1. An integrated circuit, comprising:
   a first metal line for VDD power including a first jog coupling to and being perpendicular to the first metal line, the first metal line and the first jog being formed in a first metal layer;
   a second metal line for VSS power including a second jog coupling to and being perpendicular to the second metal line, the second metal line and the second jog being formed in the first metal layer;
   a third metal line extending over and running parallel to the first jog, the third metal line being formed in a second metal layer above the first metal layer;
   a fourth metal line extending over and running parallel to the second jog, the fourth metal line being formed in the second metal layer;
   an upper cell boundary and a lower cell boundary in an X direction; and
   a first cell boundary and a second cell boundary in a Y direction;
   wherein
      the upper cell boundary is defined in a portion of the first metal line;
      the lower cell boundary is defined in a portion of the second metal line; and
      the first cell boundary is defined in a portion of the first jog and a portion of the second jog.

2. The integrated circuit of claim 1, wherein the first metal line together with the first jog form a first L-like shape metal line, and the second metal line together with the second jog form a second L-like shape metal line.

3. The integrated circuit of claim 2, wherein the first and second L-like shape metal lines are formed on respective corners of a same side of the cell.

4. The integrated circuit of claim 1, further comprising a third jog coupled to the first metal line; wherein the second cell boundary is defined in a portion of the third jog; and the first metal line together with the first jog and the third jog form a U-like shape metal line.

5. The integrated circuit of claim 1, further comprising a fourth jog coupled to the second metal line; wherein the second cell boundary is defined in a portion of the fourth jog; and the second metal line together with the second jog and the fourth jog form a U-like shape metal line.

6. The integrated circuit of claim 1, wherein length of the first jog is equal to length of the second jog.

7. The integrated circuit of claim 1, wherein length of the first jog is different from length of the second jog.

8. An integrated circuit, comprising:
   a first metal line for VDD power including a first jog coupling to and being perpendicular to the first metal line, the first metal line and the first jog being formed in a first metal level;
   a second metal line for VSS power including a second jog coupling to and being perpendicular to the second metal line, the second metal line and the second jog being formed in the first metal level;
   a third metal line overlying and running parallel to the first jog, the third metal line being formed in a second metal level above the first metal level;
   a fourth metal line overlying and running parallel to the second jog, the fourth metal line being formed in the second metal level;
   an upper cell boundary and a lower cell boundary along an X direction; and
   a first cell boundary and a second cell boundary along a Y direction;
   wherein
      the upper cell boundary is defined in a portion of the first metal line;
      the lower cell boundary is defined in a portion of the second metal line;
      the first cell boundary is defined in a portion of the first jog; and
      the second cell boundary is defined in a portion of the second jog.

9. The integrated circuit of claim 8, wherein the first metal line together with the first jog form a first L-like shape metal line, and the second metal line together with the second jog form a second L-like shape metal line.

10. The integrated circuit of claim 9, wherein the first and the second L-like shape metal lines are formed diagonally on opposite corner of the cell.

11. The integrated circuit of claim 9, wherein the first and the second L-like shape metal lines are formed on respective corners of a same side of the cell.

12. The integrated circuit of claim 8, wherein length of the first jog is equal to length of the second jog.

13. The integrated circuit of claim 8, wherein length of the first jog is different from length of the second jog.

14. An integrated circuit, comprising:
   a first cell and a second cell, each of the first cell and the second cell including a metal line of a first power line and a metal line of a second power line in a metal layer, the metal line of the first power line and the metal line of the second power line being formed in a first metal level;
   a first metal extension coupling to and being perpendicular to the metal line of the first power line of each of the first cell and the second cell in the metal layer, the first metal extension being formed in the first metal level;
   a second metal extension coupling to and being perpendicular to the metal line of the second power line of each of the first cell and the second cell in the metal layer, the first metal extension being formed in the first metal level;
   a first overlying metal line above the first metal extension and being formed in a second metal level above the first metal level;
   a second overlying metal line above the second metal extension and being formed in the second level;
   a first cell boundary for each of the first cell and the second cell, defined by a portion of the first metal; and
   a second cell boundary for each of the first cell and the second cell, defined by a portion of the second metal;
   wherein
      the first cell and the second cell are abutted against one another in X directions; and
      the first metal of the first cell and the first metal of the second cell are vertically aligned in a Y direction.

15. The integrated circuit of claim 14, wherein the first metal of the first cell is physically separated from the first metal of the second cell.

16. The integrated circuit of claim 14, wherein the first metal of the first cell is coupled to the first metal of the second cell.

17. The integrated circuit of claim 14, wherein the first metals and the second metals of the first cell and the second cell are vertically aligned in the Y direction.

18. The integrated circuit of claim 17, wherein the second metals of the first cell and the second cell are vertically interposed between the first metals of the first cell and the second cell.

19. The integrated circuit of claim 14, wherein length of the first metal is equal to length of the second metal.

20. The integrated circuit of claim 14, wherein length of the first metal is different from length of the second metal.

* * * * *